(12) United States Patent
Kolb et al.

(10) Patent No.: US 9,231,026 B2
(45) Date of Patent: Jan. 5, 2016

(54) MAGNETORESISTIVE SENSOR MODULE WITH A STRUCTURED METAL SHEET FOR ILLUMINATION AND METHOD FOR MANUFACTURING THE SAME

(75) Inventors: Stefan Kolb, Unterschleissheim (DE); Klemens Pruegl, Regensburg (DE); Juergen Zimmer, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 658 days.

(21) Appl. No.: 11/360,538

(22) Filed: Feb. 23, 2006

(65) Prior Publication Data

US 2006/0202291 A1 Sep. 14, 2006

(30) Foreign Application Priority Data

Feb. 23, 2005 (DE) .......................... 10 2005 008 368
Oct. 4, 2005 (DE) .......................... 10 2005 047 414

(51) Int. Cl.
*H01L 43/12* (2006.01)
*H01L 27/22* (2006.01)

(52) U.S. Cl.
CPC ................ *H01L 27/22* (2013.01); *H01L 43/12* (2013.01)

(58) Field of Classification Search
CPC ......... H01L 43/12; H01L 43/02; H01L 43/08; H01L 27/22
USPC .............................................................. 438/3
See application file for complete search history.

(56) References Cited

U.S. PATENT DOCUMENTS

| | | | | |
|---|---|---|---|---|
| 6,703,132 | B1 * | 3/2004 | Yasuda et al. | 428/447 |
| 7,119,006 | B2 * | 10/2006 | Kraft | 438/622 |
| 2002/0027257 | A1 * | 3/2002 | Kinsman et al. | 257/400 |
| 2003/0197503 | A1 * | 10/2003 | Kawano et al. | 324/207.21 |
| 2004/0078959 | A1 * | 4/2004 | Siegle et al. | 29/603.14 |
| 2004/0207035 | A1 | 10/2004 | Witcraft et al. | 257/427 |
| 2004/0241338 | A1 * | 12/2004 | Foster et al. | 427/487 |
| 2005/0275941 | A1 * | 12/2005 | Liu et al. | 359/407 |
| 2006/0088947 | A1 * | 4/2006 | Lien et al. | 438/3 |

FOREIGN PATENT DOCUMENTS

| | | | | |
|---|---|---|---|---|
| DE | 198 54 713 A1 | 11/1999 | | G01R 33/02 |
| DE | 203 03 492 U1 | 6/2003 | | H01L 23/522 |
| DE | 102 59 707 A1 | 12/2003 | | H01L 43/08 |
| EP | 0 936 673 B1 | 12/1998 | | H01L 27/108 |
| WO | WO 03/085410 A1 | 10/2003 | | G01R 31/316 |
| WO | WO 2004/015437 A1 | 2/2004 | | G01R 33/09 |

* cited by examiner

*Primary Examiner* — Thanh V Pham
(74) *Attorney, Agent, or Firm* — Eschweiler & Associates, LLC

(57) ABSTRACT

In the method of manufacturing a magnetoresistive sensor module, at first a composite arrangement out of a semiconductor substrate and a metal-insulator arrangement is provided, wherein a semiconductor circuit arrangement is integrated adjacent to a main surface of the semiconductor substrate into the same, wherein the metal-insulator arrangement is arranged on the main surface of the semiconductor substrate and comprises a structured metal sheet and insulation material at least partially surrounding the structured metal sheet, wherein the structured metal sheet is electrically connected to the semiconductor circuit arrangement. Then, a magnetoresistive sensor structure is applied onto a surface of the insulation material of the composite arrangement, and finally an electrical connection between the magnetoresistive sensor structure and the structured metal sheet is established, so that the magnetoresistive sensor structure is connected to the integrated circuit arrangement.

30 Claims, 6 Drawing Sheets

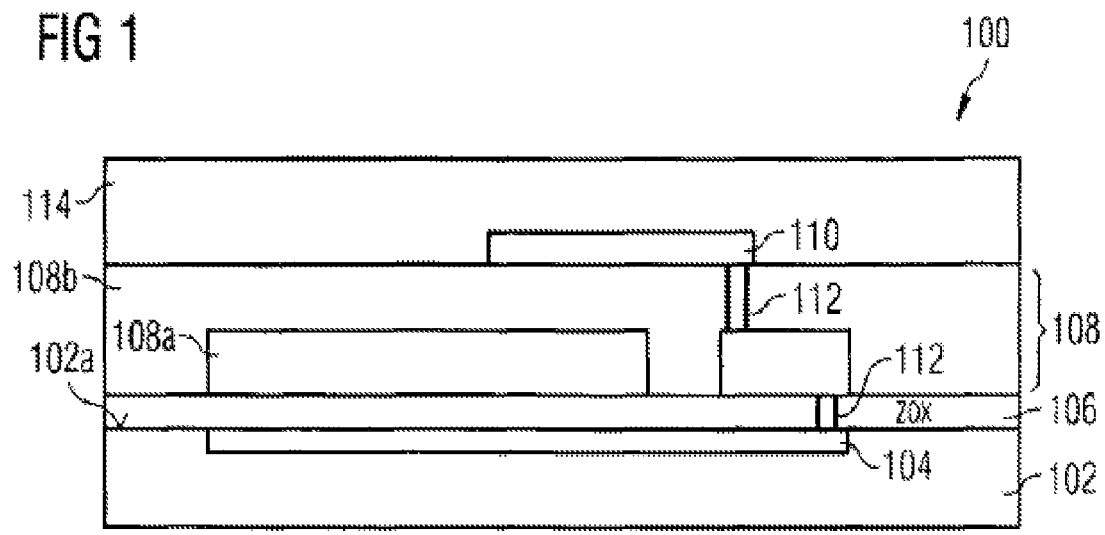
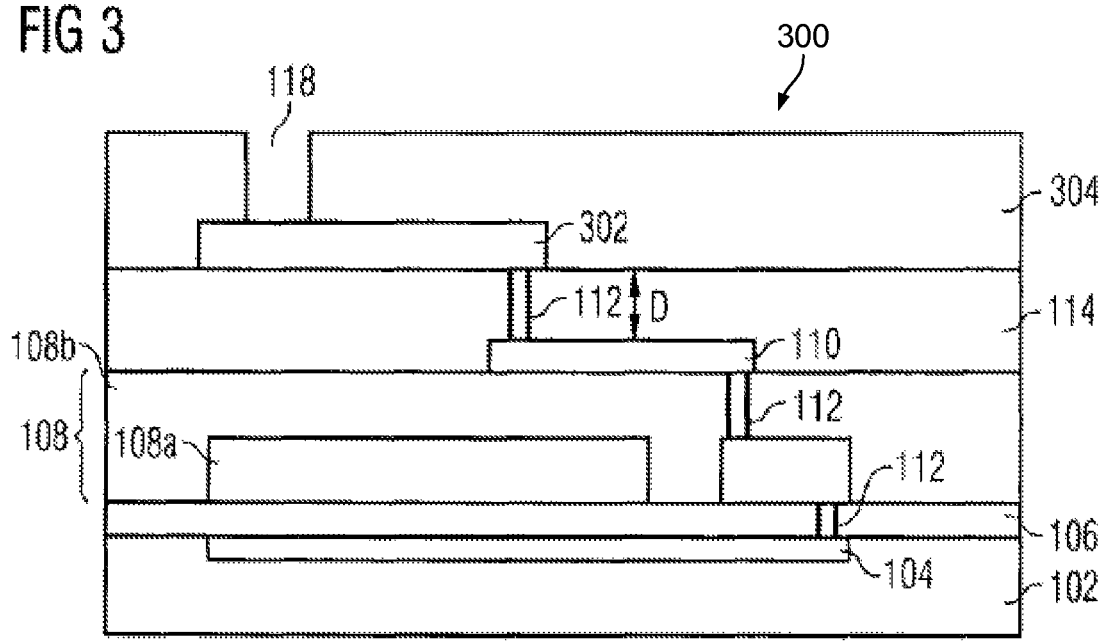

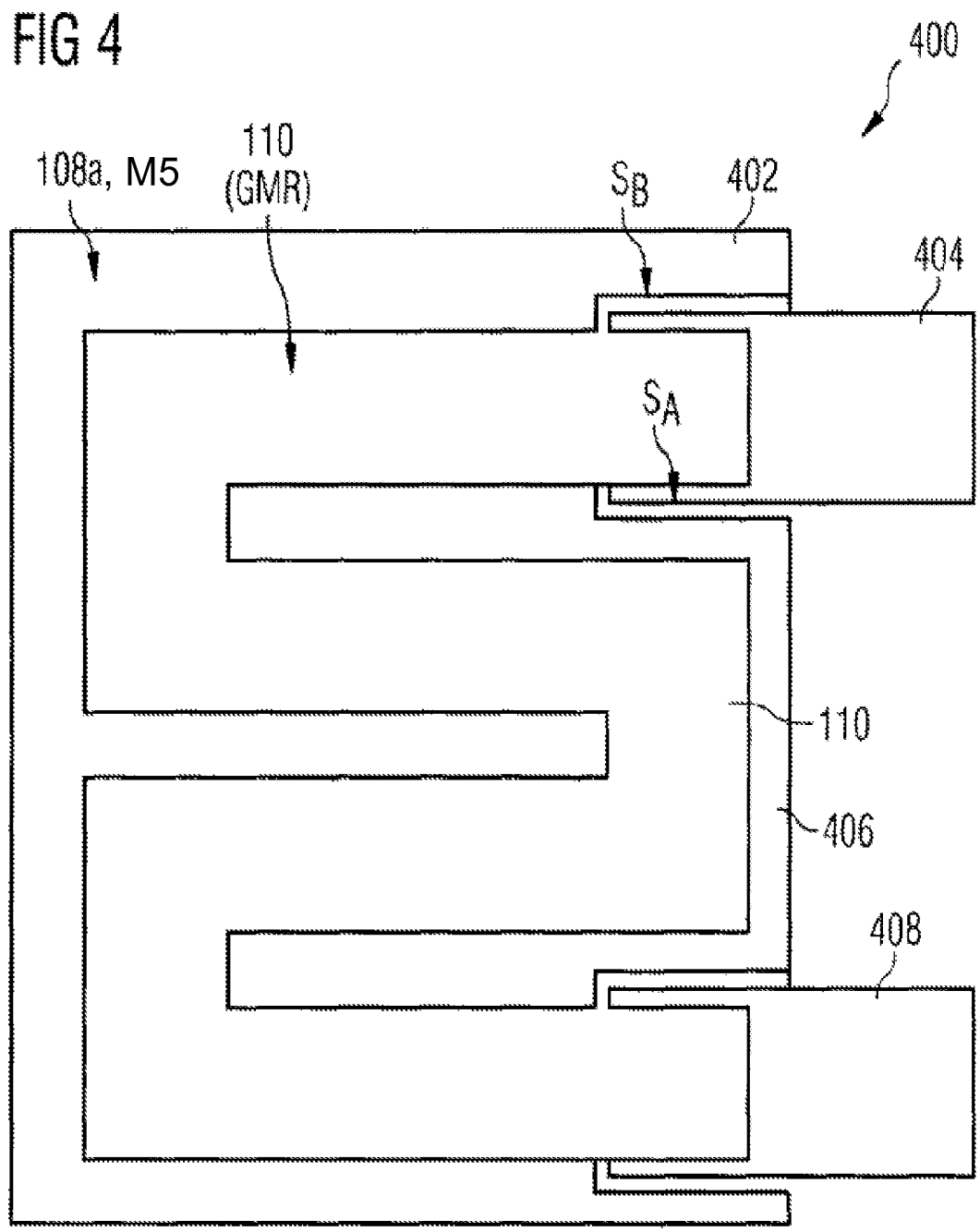

Pin-out

Functional Block Diagram

MAGNETORESISTIVE SENSOR MODULE WITH A STRUCTURED METAL SHEET FOR ILLUMINATION AND METHOD FOR MANUFACTURING THE SAME

PRIORITY

This application claims priority from German Patent Application No. 10 2005 008 368.4, which was filed on Feb. 23, 2005, and German Patent Application No. 10 2005 047 414.4, which was filed on Oct. 4, 2005, which are incorporated herein by reference in their entirety.

TECHNICAL FIELD

The present invention relates to magnetoresistive sensor modules and, in particular, to a procedure for manufacturing magnetoresistive sensor modules, preferably with a multiplicity of individual magnetoresistive sensor elements for the detection and evaluation of external magnetic fields.

BACKGROUND

Sensors converting magnetic or magnetically coded information to an electric signal play an ever-greater role in today's technology. They find application in all fields of technology in which the magnetic field may serve as an information carrier, i.e. in vehicle technology, mechanical engineering/robotics, medical technology, non-destructive materials testing, and in micro-system technology. With the aid of such sensors, a multiplicity of different mechanical parameters are sensed, such as position, velocity, angular position, rotational speed, acceleration, etc., but current flow, wear, or corrosion may also be measured.

For the sensing and evaluation of magnetic or magnetically coded information, magnetoresistive devices or sensor elements are increasingly employed in technology. Magnetoresistive devices, which may be arranged as single elements or also in form of a plurality of connected single elements, increasingly find application today in numerous applications for contactless position and/or movement detection of a giver object with reference to a sensor arrangement, particularly in automobile technology, such as for ABS systems, traction control systems, etc. For this purpose, rotation angle sensors on the basis of magnetoresistive elements or structures, which will generally be referred to as xMR structures in the following, are frequently used. In the following description, the term "xMR structure" shall include all known magnetoresistive structures, such as AMR (anisotropic magnetoresistance) structures, GMR (giant magnetoresistance) structures, CMR (colossal magnetoresistance) structures, TMR (tunnel magnetoresistance) structures, or EMR (extraordinary magnetoresistance) structures. In technical applications of GMR sensor arrangements, so-called spin valve structures are preferably used today, as illustrated in FIGS. 5a-c, for example.

In the following, it will now at first be briefly gone into GMR structures in general. GMR structures are almost always operated in a so-called CIP (current-in-plane) configuration, i.e. the applied current flows in parallel to the sheet structure. In the GMR structures, there are some basic types that have gained acceptance in practice. In practice, e.g. when employed in automobile technology, above all large temperature windows, for example from −40° C. to +150° C., and small field strengths of few kA/m are necessary for optimum and safe operation. The most important GMR structures for the practical employment are illustrated in FIGS. 5a-c.

The GMR structure illustrated in FIG. 5a shows the case of a coupled GMR system 500, in which magnetic layers 502, 506, e.g. of cobalt (Co), are separated by a non-magnetic layer 504, e.g. of copper (Cu). The thickness of the non-magnetic layer 504 is chosen so that antiferromagnetic coupling of the soft-magnetic layers 502, 506 develops without a magnetic field applied. This is meant to be illustrated by the depicted arrows. An external field then forces the parallel orientation of the magnetization of the soft-magnetic layers 502, 506, whereby the resistance of the GMR structure decreases.

The GMR structure illustrated in FIG. 5b shows a spin valve system 501, in which the non-magnetic layer 504 is chosen so thick that no more coupling of the soft-magnetic layers 502, 506 develops. The lower magnetic layer 506 is strongly coupled to an antiferromagnetic layer 508, so that it is magnetically hard (comparable with a permanent magnet). The upper magnetic layer 502 is soft magnetic and serves as measuring layer. It may be remagnetized by already a small external magnetic field M, whereby the resistance R changes.

In the following, it is now gone into the spin valve arrangement 501 illustrated in FIG. 5b in greater detail. Such a spin valve structure 501 consists of a soft-magnetic layer 502, which is separated, by a non-magnetic layer 504, from a second soft-magnetic layer 506, the magnetization direction of which is, however, pinned by the coupling with an antiferromagnetic layer 508 by means of the so-called "exchange bias interaction". The principle functioning of a spin valve structure may be illustrated by means of the magnetization and R(H) curve in FIG. 5b. The magnetization direction of the magnetic layer 506 is pinned in negative direction. If the external magnetic field M is increased from negative to positive values, the "free", soft-magnetic layer 502 switches near the zero crossing (H=0), and the resistance R rises sharply. The resistance R then remains high until the external magnetic field M is great enough to overcome the exchange coupling between the soft-magnetic layer 506 and the antiferromagnetic layer 508 and to switch also the magnetic layer 506.

The GMR structure illustrated in FIG. 5c differs from the GMR structure illustrated in FIG. 5b in that here the lower antiferromagnetic layer 508 is replaced by a combination of a natural antiferromagnet 510 and a synthetic antiferromagnet (SAF) 506, 507, 509 on top, consisting of the magnetic layer 506, a ferromagnetic layer 507, and a non-magnetic layer 509 in between. In this manner, the magnetization direction of the magnetic layer 506 is pinned. The upper, soft-magnetic layer 502 in turn serves as measuring layer, the magnetization direction of which may easily be rotated by an external magnetic field M. The advantage of the use of the combination of natural and synthetic antiferromagnets as compared to the construction according to FIG. 5b is the greater field and temperature stability.

In the following, it is now gone into so-called TMR structures in general. For TMR structures, the application spectrum is very similar to that of GMR structures. FIG. 6 shows a typical TMR structure. The tunnel magnetoresistance TMR is obtained in tunnel contacts, in which two ferromagnetic electrodes 602, 606 are decoupled by a thin, insulating tunnel barrier 604. Electrons can tunnel through this thin barrier 604 between the two electrodes 602, 606. The tunnel magnetoresistance is based on the tunnel current being dependent on the relative orientation of the magnetization direction in the ferromagnetic electrodes.

The magnetoresistive structures (GMR/TMR) previously described thus have an electrical characteristic dependent on an applied magnetic field, i.e. the resistivity of an xMR structure of a magnetoresistive device is influenced by an influencing external magnetic field.

In bridge arrangement, rotation angle sensors on the basis of the GMR effect may provide an inherent 360° uniqueness of the magnetic field to be detected and have relatively high sensitivity with reference to the magnetic field to be detected.

In order to realize 360° detection by means of a magnetoresistive structure and particularly an GMR/TMR spin valve structure of a plurality of magnetoresistive devices, to detect the rotation direction of a wheel or a shaft with reference to the sensor arrangement, for example, eight magnetoresistive devices are connected with two Wheatstone bridge arrangements (connected in parallel), wherein one of the bridge circuits has reference magnetizations aligned perpendicularly to those of the other bridge circuit. Within each bridge circuit of four magnetoresistive devices, the reference magnetizations are arranged in antiparallel manner, so that both bridge circuits provide sinusoidal signals dependent on the rotation angle of an external magnetic field, which are 90° phase shifted with respect to each other. Via an arctan computation of both output signals, i.e. the output signal of the first and second bridge circuits, the angle over a 360° range can be uniquely determined.

The reference magnetizations of the individual elements of the GMR/TMR spin valve structure may have up to four locally different directions. For adjusting the reference direction, the spin valve layer system has to be heated above the so-called "blocking temperature" (depending on magnetoresistive material system employed) up to 400° C. and cooled again in a lateral magnetic field of the desired direction. This procedure is also referred to as conditioning the magnetoresistive structure. For manufacturing a magnetoresistive sensor structure, locally heating the respective individual elements is therefore required, without also heating neighboring magnetoresistive elements above the blocking temperature during the magnetization procedure. Here, one possibility is locally illuminating with a laser with sufficient radiation energy per unit area, for example.

In FIG. 7, a principle circuit diagram of a possible connection in form of a double bridge circuit 700 with eight magnetoresistive magnetic field sensor elements is illustrated. The double bridge arrangement 700 includes a first bridge circuit arrangement 702 and a second bridge circuit arrangement 704, each out of four magnetoresistive individual elements 702a-b, 704a-b, the magnetizations of which are indicated with reference to the x-axis and y-axis illustrated in FIG. 7. The first bridge circuit 702 includes two magnetoresistive devices 702a with permanent magnetization antiparallel to the x-axis indicated and two magnetoresistive devices 702b with permanent magnetization parallel to the x-axis. The double bridge circuit arrangement 700 further includes a second bridge circuit 704, which comprises two magnetoresistive devices 704a with permanent magnetization in the y direction and two magnetoresistive devices 704b with permanent magnetization antiparallel to the y direction each. The individual magnetoresistive devices 702a, 702b, 704a, 704b are connected, as indicted in FIG. 7, wherein the first and second bridge circuits 702 and 704 are connected to each other in parallel and further connected between a supply voltage and a ground potential.

During the operation of the magnetoresistive sensor arrangement 700 of FIG. 7, the first bridge circuit 702 provides an output signal $V_X$ between the two center taps of the first bridge circuit, wherein the second bridge circuit 704 provides an output signal $V_Y$ between the two center taps of the second magnetoresistive bridge circuit. The connection of the magnetoresistive devices 702a,b and 704a,b described with reference to FIG. 7 allows for the detection of an external, rotating magnetic field over an angle range of 360°. The sinusoidal output signals $V_X$ and $V_Y$ of the two bridge circuits connected in parallel are obtained as a function of the rotating, external magnetic field, wherein the two output signals $V_X$ and $V_Y$ are phase shifted with reference to each other by an angle of 90° each.

GMR sensor elements are constructed such that meander-shaped GMR structures form the resistance elements, which are preferably connected in a bridge circuit. Meander-shaped structures are used to provide sufficiently long, magnetoresistive resistance elements, so that sufficiently high changes in resistance can be determined.

Manufacturing processes known in the prior art for GMR/TMR sensor elements include only the construction of a GMR/TMR sensor device and its contacting. Up to now, only GMR or TMR sensor structures in form of discrete devices are known. GMR/TMR sensor devices previously known in the prior art substantially are magnetoresistive resistance structures accommodated in normal SMD (surface mounted device) packages, wherein a GMR sensor device and its pin occupancy (terminal occupancy) are shown in FIG. 8a, for example. In FIG. 8b, the accompanying functional block diagram is illustrated in principle. The sensor device illustrated in FIG. 8a is to be coupled externally with an evaluating circuit (not shown in FIGS. 8a-b).

An electronic circuit externally associated with the GMR sensor device 800 is required to calibrate the sensor output signal (out+, out−), in order to obtain high absolute accuracy of a GMR sensor arrangement on the one hand. An electronic circuit is also required to condition the sensor output signal and also to provide the sensor output signal in a correspondingly processed, digital or analog interface for further evaluation. Such an additional electronic circuit has to be made available in form of a second device on a circuit board, for example.

According to the prior art, it is indeed also possible to accommodate the electronic circuit for evaluating or rendering the GMR sensor output signal on an additional semiconductor chip to the GMR sensor element within a device package, wherein the GMR sensor element and the semiconductor chip are connected to each other by means of bond wires, for example. But this procedure is problematic in that the necessary chip areas and the connection of both chips, i.e. of the GMR sensor element and the electronic evaluation and rendering circuit, generate corresponding, additional chip costs and assembly costs due to the greater package effort owing to the additional bondings between the GMR sensor element and the semiconductor chip. This additional package effort may also lead to increased parasitic influences, which may affect the sensor properties. Moreover, it should be noted that the final sensor application is limited to the package shapes customary in the market for reception and connection of two chips, i.e. the GMR sensor element and the electronic evaluating and rendering circuit.

SUMMARY

Starting from this prior art, it is an object of the present invention to provide a simplified procedure for manufacturing a magnetoresistive sensor arrangement, with which a magnetoresistive sensor module, which can be accommodated in space-saving manner, can be realized.

In accordance with a first aspect, the present invention provides a method of manufacturing a magnetoresistive sensor module, with the steps of: providing a composite arrangement out of a semiconductor substrate, wherein a semiconductor circuit arrangement is integrated adjacent to a main surface of the semiconductor substrate into the same, and a metal-insulator arrangement, wherein the metal-insulator arrangement is arranged on the main surface of the semiconductor substrate and has a structured metal sheet and insulation material at least partially surrounding the structured metal sheet, wherein the structured metal sheet is electrically connected to the semiconductor circuit arrangement, applying a magnetoresistive sensor structure onto a surface of the insulation material of the composite arrangement, and establishing an electrical connection between the magnetoresistive sensor structure and the structured metal sheet, so that the magnetoresistive sensor structure is connected to the integrated circuit arrangement.

In accordance with a second aspect, the present invention provides a magnetoresistive sensor module, having: a composite arrangement out of a semiconductor substrate, wherein a semiconductor circuit arrangement is integrated adjacent to a main surface of the semiconductor substrate into the same, and a metal-insulator arrangement, wherein the metal-insulator arrangement is arranged on the main surface of the semiconductor substrate and has a structured metal sheet and insulation material at least partially surrounding the structured metal sheet, wherein the structured metal sheet is electrically connected to the semiconductor circuit arrangement, and a magnetoresistive sensor structure, which is applied on a surface of the insulation material of the composite arrangement, wherein an electrical connection between the magnetoresistive sensor structure and the structured metal sheet is made, so that the magnetoresistive sensor structure is connected to the integrated circuit arrangement.

The inventive procedure for manufacturing a magnetoresistive sensor element includes the following steps. At first, a composite arrangement of a semiconductor substrate and a metal-insulator arrangement are provided. The semiconductor substrate has an active semiconductor circuit arrangement integrated in the semiconductor substrate adjacent to a main surface thereof. The metal-insulator arrangement is arranged on the main surface of the semiconductor substrate and comprises a structured metal sheet and insulating material at least partly surrounding the structured metal sheet, wherein the structured metal sheet is electrically connected to the semiconductor circuit arrangement.

A magnetoresistive structure is now applied on a surface of an exposed area of the insulation material of the composite arrangement, wherein also an electrical connection between the magnetoresistive structure and the structured metal sheet is made, so that the magnetoresistive structure is connected to the integrated circuit arrangement (via the structured metal sheet).

The magnetoresistive sensor module according to the invention includes a composite arrangement of a semiconductor substrate and a metal-insulator arrangement, wherein a semiconductor circuit arrangement is integrated in the semiconductor substrate adjacent to a main surface thereof. The metal-insulator arrangement is arranged on the main surface of the semiconductor substrate and comprises a structured metal sheet and insulation material at least partly surrounding the structured metal sheet, wherein the structured metal sheet is electrically connected to the semiconductor circuit arrangement. On a surface or an exposed area of the insulation material of the composite arrangement, now a magnetoresistive structure is applied, wherein this is electrically connected to the structured metal sheet, so that the magnetoresistive structure is electrically connected to the integrated circuit arrangement.

The present invention is based on the finding that a magnetoresistive sensor device and, in particular, a GMR/TMR sensor module may be obtained by expanding the manufacturing process for an integrated semiconductor circuit arrangement on a semiconductor substrate, such as a semiconductor wafer, in that, in addition to the integrated semiconductor circuit arrangements in the semiconductor substrate and a metal-insulator layer stack arranged on top, a magnetoresistive layer structure (xMR structure) is applied on an outwardly exposed area of the insulation material of the metal-insulator layer arrangement, wherein preferably vias are further provided both between the at least one structured metal sheet on the one hand to the integrated circuit arrangements on the semiconductor substrate and vias to pads of the magnetoresistive structure.

Preferably, an optional passivation layer, for example, of oxide or nitride material, for performing a protective function is now also applied on the magnetoresistive structure on the metal-insulator layer stack, wherein an additional passivation layer of photoimide material, for example, may be applied in addition, wherein highly positive properties with reference to accommodation in one package may be obtained with this.

Corresponding to the advantageous procedure for manufacturing a magnetoresistive sensor module according to the present invention, the xMR process module (for the magnetoresistive structure) is preferably placed between the last metal sheet of the basic manufacturing process and the passivation layer arrangement disposed thereon. For example, in case of a GMR sensor element, the GMR sensor element is now preferably connected to a metal sheet of the metal-insulator layer stack from underneath, wherein this is obtained by the use of a manufacturing process for an additive tungsten plug or a tungsten plug already present, for example. Via the connection to the metal sheet, an electrical connection of the magnetoresistive sensor element with the active semiconductor circuit arrangement on the semiconductor substrate is now also possible.

In the case of the contacting of a TMR sensor element, for example, an electrical connection of this sensor element with the active semiconductor circuit arrangement on the semiconductor substrate may be achieved by arranging an additive metal sheet above the TMR layer structure, for example with gold or with an alternative metal compound, which may be connected to the TMR layer structure via vias.

The inventive concept for manufacturing a magnetoresistive sensor module thus enables an arrangement, which is space saving with reference to the existing chip area, of the magnetoresistive sensor structure to be performed on active electronic devices, i.e. semiconductor circuit arrangements.

Thus, it is an advantage of the present invention that a magnetoresistive sensor device, and particularly a GMR or TMR sensor device, may be manufactured and integrated with the integrated electronic semiconductor devices within a semiconductor manufacturing process. Moreover, according to the inventive concept, adding the manufacturing process for the magnetoresistive sensor element to the basic semiconductor manufacturing process may now be done so that the integrated semiconductor devices obtained in the basic semiconductor manufacturing process remain substantially uninfluenced by the manufacturing steps of the magnetoresistive sensor element.

It is particularly advantageous in the inventive concept for manufacturing a magnetoresistive sensor module that the manufacturing process block for manufacturing the magnetoresistive sensor element may substantially be applied to all other semiconductor manufacturing processes and semiconductor circuit arrangements or applications in modular manner.

A technical realization of the manufacturing method according to the invention thus allows for the manufacture of magnetic field sensor modules in vertical integration by means of a metal layer stack with one or more metal layers and insulating layers there between. The metal layer stack is arranged above the active chip area in a dielectric, for example oxide material, wherein the permanently magnetizable magnetic field sensor structure is preferably arranged within a passivation layer, e.g. a plasma nitride layer. Furthermore, vias for connecting the magnetic field sensor structure to a metal layer of the metal layer stack are illustrated.

With reference to the present invention, it is to be noted that the metal layer stack with the xMR layer structure may be manufactured in substantially technology-independent manner. The metal layer stack with the xMR-layer structure may thus be integrated onto the chip passivation above the active chip area in vertical integration or without active circuit and without routing in horizontal integration.

The wiring of the xMR magnetic field sensor structure may take place above the xMR magnetic field sensor structure by introducing an additional metal plane or on a metal plane already present by the interconnects or vias. Below the xMR layer stack, on the metal layer, a metallic protection plate, for example, is allowed for, which on the one hand protects the underlying logic circuits in the active chip area from the laser light in a laser writing process and on the other hand balances the temperature gradients, which may exert a strong influence on the accuracy on the xMR magnetic field sensor structure by causing an offset signal.

The metal planes of the metal layer stack may themselves also be embodied as lightproof shields. In this, it is to be noted that the metal planes of the metal layer stack may be embodied as current conductor structures for contacting different sensor structure portions, for example, with certain parts of the integrated circuit arrangement (e.g. via vias). These individual current conductor structures, however, must not abut each other and hence are preferably separated from each other by an insulation layer. This insulation layer is, however, generally translucent. So as to not put the underlying active circuits in the semiconductor material at risk by incident laser light in the writing procedure, additional metal plates or also other opaque arrangements, which are disposed directly under the clearances or gaps in the metal layer plane (in the layout), should be introduced on one of the metal layers. According to the present invention, it is possible that a metal plane or also a combination of several metal planes forms the shield lightproof with reference to the laser light wavelengths used.

BRIEF DESCRIPTION OF THE DRAWINGS

These and other objects and features of the present invention will become clear from the following description taken in conjunction with the accompanying drawings, in which:

FIG. 1 is a schematic cross-sectional illustration of a magnetoresistive sensor module according to the present invention;

FIG. 3 is a schematic cross-sectional illustration of a magnetoresistive sensor module according to a further embodiment of the present invention;

FIG. 4 is a schematic illustration in top view onto a magnetoresistive sensor module according to a further embodiment of the present invention;

DETAILED DESCRIPTION

Figure 2:
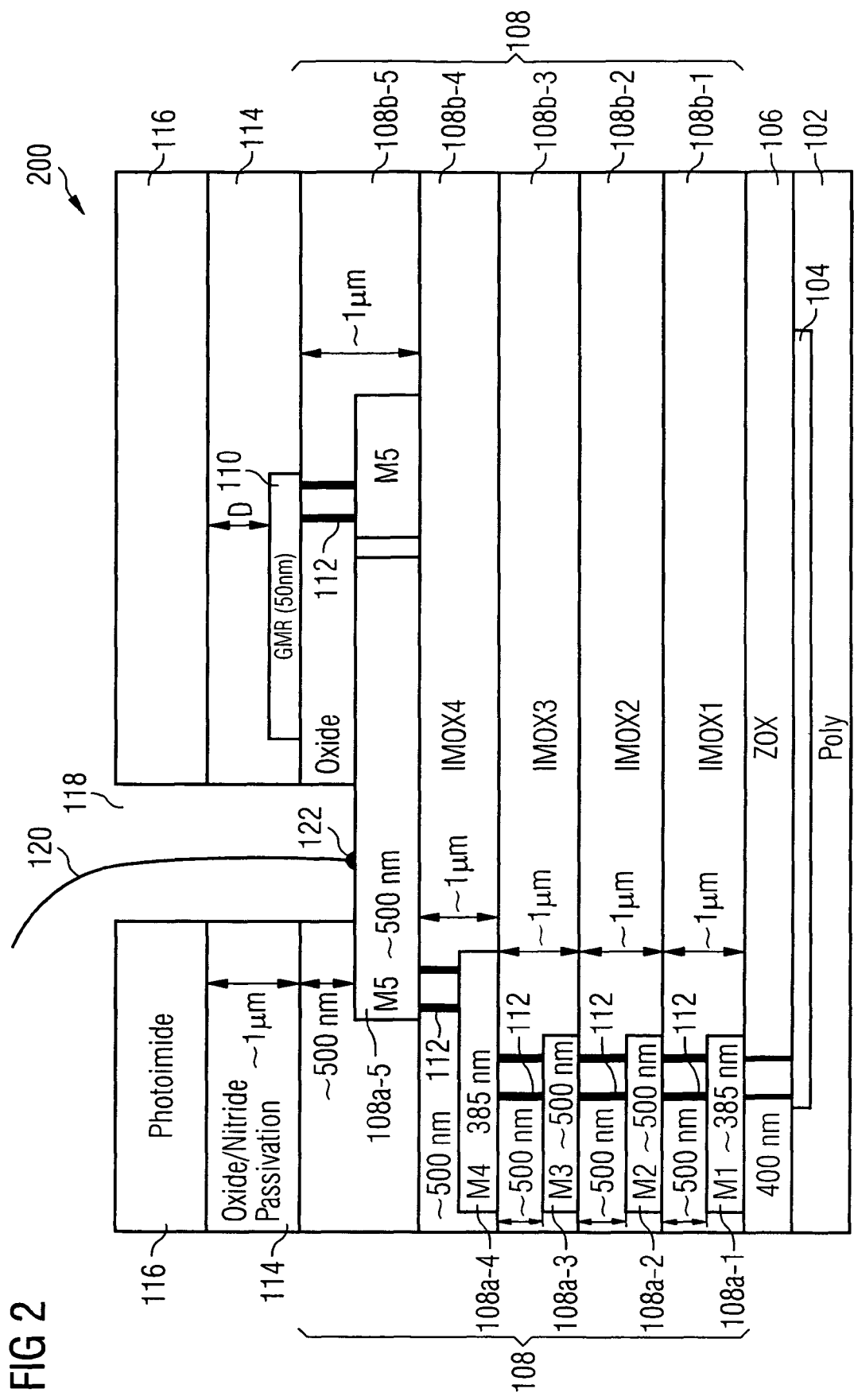
FIG. 2 is a schematic cross-sectional illustration of a magnetoresistive sensor module according to a further embodiment of the present invention.
Figure 5A:
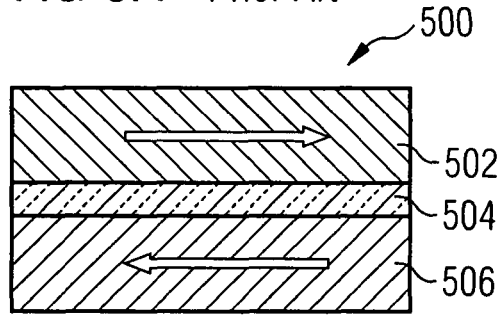
FIGS. 5*a-c* are schematic illustrations of the principle construction of various types of GMR sensor elements and the accompanying schematic illustration of the magnetic field dependence of the magnetization and the resistance of the magnetoresistive structure according to the prior art.
Figure 5B:
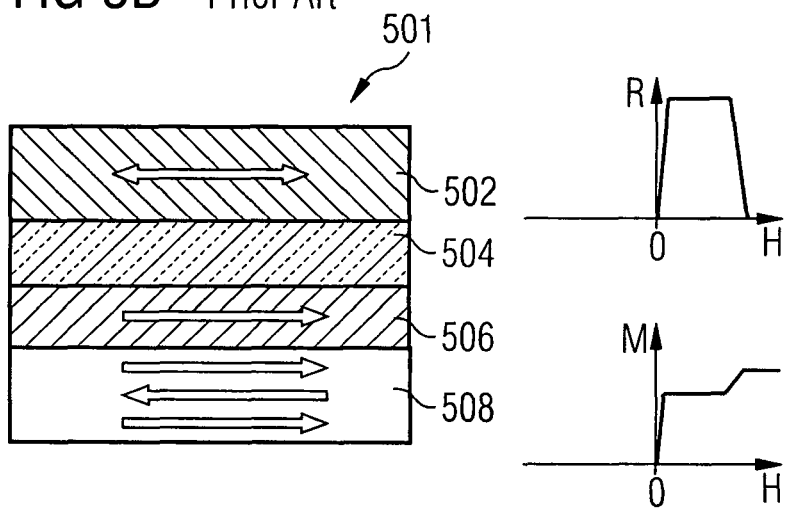
Figure 5C:
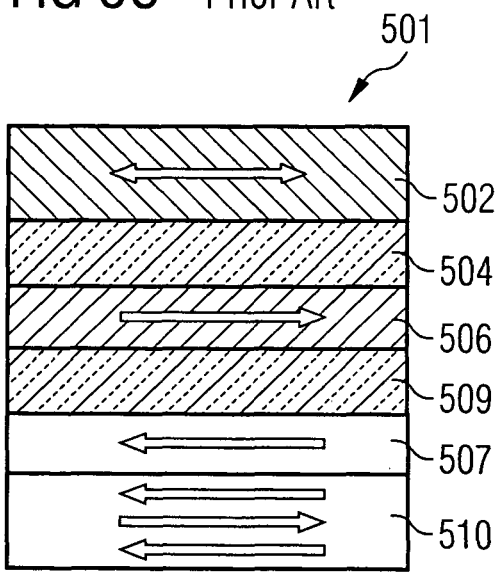
Figure 6:
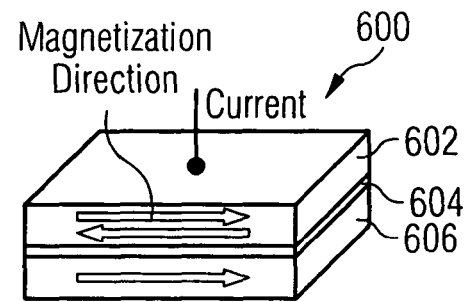
FIG. 6 is a schematic illustration of a magnetoresistive TMR sensor element.
Figure 7:
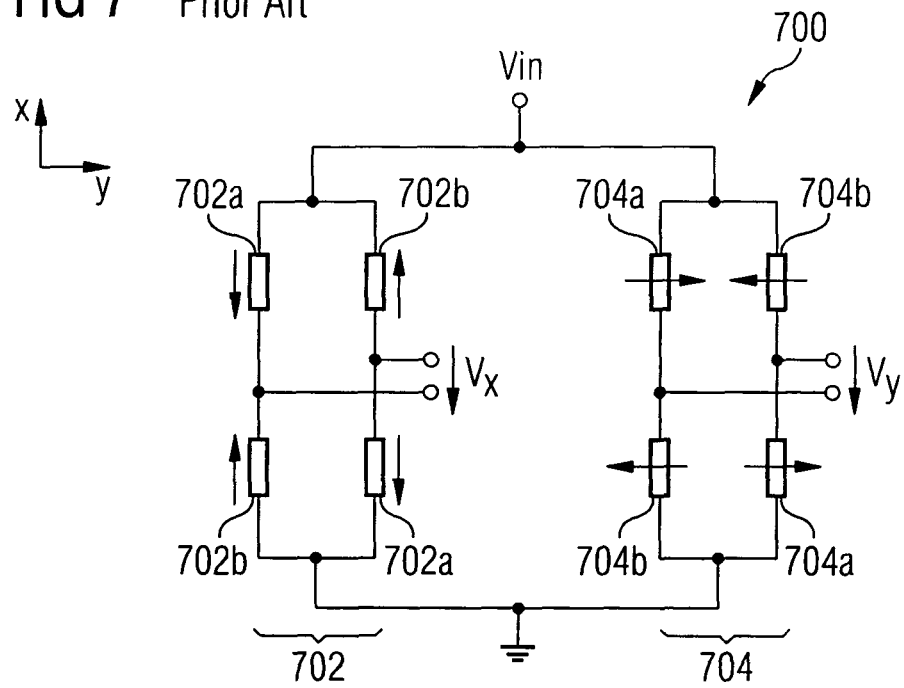
FIG. 7 is a principle illustration of a bridge circuit construction of a magnetoresistive sensor arrangement for angle determination of an external magnetic field according to the prior art.
Figure 8A:
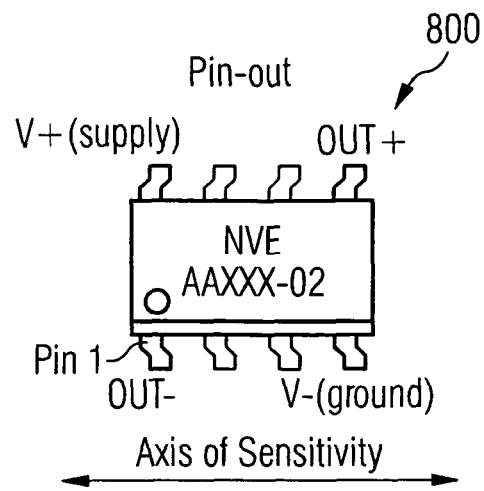
FIGS. 8*a-b* are a GMR device with pin occupancy and a functional block diagram according to the prior art.
Figure 8B:
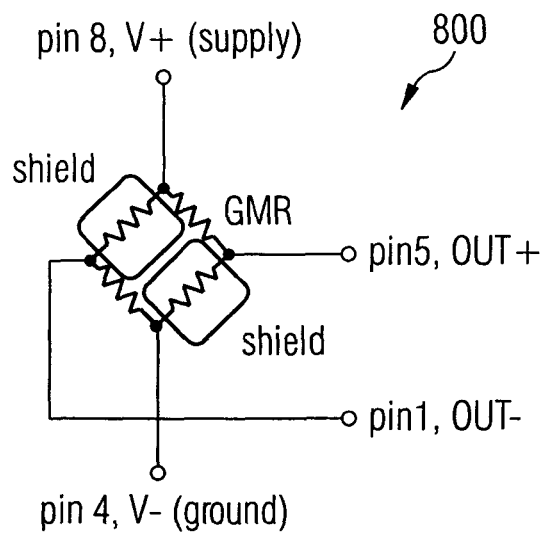

In the following, with reference to FIG. 1, a first embodiment according to the invention of a magnetoresistive sensor module and the corresponding method of manufacturing the same will now be explained in detail.

FIG. 1 shows a schematic cross-sectional illustration through a magnetoresistive sensor module 100 according to a first embodiment of the present invention. The magnetoresistive sensor module 100 includes a semiconductor substrate 102, e.g. of silicon and/or polysilicon material with a first main surface 102*a*, wherein a semiconductor circuit arrangement 104 is integrated adjacent to the main surface 102*a* of the semiconductor substrate 102 into the same. According to the present invention, the semiconductor circuit arrangement 104 integrated into the semiconductor substrate 102 may substantially be manufactured by means of arbitrary MOS and bipolar techniques or combinations of these techniques (BiCMOS processes), wherein the integrated circuit arrangement 104 may comprise both active devices, such as transistors, and passive devices, such as diodes, resistors, and capacitors.

With reference to the present invention, it is to be noted that the inventive concept is indeed exemplarily explained on the basis of a magnetoresistive module 100, but with the inventive concept also being advantageously applicable to methods for the mass production of magnetoresistive sensor modules on wafer level with a multiplicity of magnetoresistive devices.

In the following, it is now exemplarily gone into a basic CMOS process. In a basic CMOS process, at first the p and n wells for the creation of the substrate areas of the n channel and p channel MOS transistors, respectively, are manufactured (well process module). What follows in the course of the process is the insulation of neighboring transistors by generating a so-called field oxide between the transistors. In the so-called active areas, i.e. the regions not covered by the field oxide, the MOS transistors then develop. With this, the front part of the overall process, which provides the transistors and their mutual insulation, is completed. It is also referred to as FEOL (front end of line). In the BEOL (back end of line) part, it is now about contacting and connecting the individual mono- or polycrystalline semiconductor areas (e.g. silicon areas) of the FEOL part according to the desired integrated circuit arrangement 104. For the contacting and connection of the semiconductor areas, at least one metal sheet 108*a* is required, as this is illustrated in FIG. 1, wherein often two or more metal sheets are also used, wherein it is spoken of a multi-sheet metallization in this case. The passivation supposed to protect the integrated circuit against mechanical damage due to environmental influences and against the intrusion of impurities then forms the conclusion of the overall process.

With progressive structural shrinkage with at the same time ever greater thickness of the overall layer construction, the leveling of surfaces with steep steps plays an ever greater role, so that leveling methods may be required also according to the present invention, in order to obtain as-plane-as-possible surfaces of the various levels, such as the metal sheet 108a or the insulation layers 108b, and thus the magnetoresistive structure 110.

The magnetoresistive sensor module 100 illustrated in FIG. 1 comprises an insulation layer 106 (ZOX=Zwischenoxid=intermediate oxide) above the semiconductor substrate and the semiconductor circuit arrangement 104 integrated therein, corresponding to conventional semiconductor manufacturing processes. The insulation layer 106 may for example have a thickness on the order of 0.1 and 2 µm, and preferably in a range of about 0.5 µm. On the insulation layer 106, which preferably comprises oxide material, a metal-insulator arrangement 108 consisting of at least one metal sheet 108a and an insulation layer 108b (at least partially) surrounding this metal sheet 108a is arranged.

A magnetoresistive sensor structure 110 is applied on the metal-insulator arrangement 108 on an (outwardly) exposed area of the insulation material 108b. The thickness of the magnetoresistive sensor structures 110 ranges from about 2 to 200 µm, and preferably about 50 nm. In the scope of the present description, all xMR structures are understood as magnetoresistive structures or sensor structures, i.e. particularly AMR (anisotropic magnetoresistance) structures, GMR (giant magnetoresistance) structures, CMR (colossal magnetoresistance) structures, EMR (extraordinary magnetoresistance) structures, and TMR (tunnel magnetoresistance) structures, as well as magnetoresistance structures and spin valve structures. Here, it is to be noted that the above enumeration is not to be viewed as comprehensive, wherein substantially all magnetoresistive structures and elements can be employed with reference to the present invention.

As illustrated in FIG. 1, the metal sheet 108a is preferably connected to connecting areas on the integrated semiconductor circuit arrangement 104 via vias 112. Furthermore, electrically conductive vias 112 are arranged between the structured metal sheet 108a and preferably connecting areas of the magnetoresistive sensor structure 110, so that preferably an electrical connection of the magnetoresistive structure 110 with default connecting areas of the active circuit arrangement 104 can be made. In the following, it will still be gone into specific embodiments of the vias 112 in greater detail.

Furthermore, as shown in FIG. 1 with reference to the magnetoresistive sensor module 100 illustrated there, a covering, completing cap layer arrangement 114 is optionally arranged on the metal-insulator arrangement 108 and the magnetoresistive sensor structure 110 arranged thereon.

As already indicated previously, the course of the process for the manufacture of the active and passive devices of the circuit arrangement 104 in the semiconductor substrate 102 is dealt with in the front part of the overall manufacturing process (FEOL=front end of line). In the BEOL (back end of line) part of the overall process, the individual devices are now connected to each other so that the desired magnetoresistive sensor module 100 is obtained.

Although diffused regions as well polysilicon or polycide traces may be utilized intensively for the electrical connection of the various devices of the integrated circuit arrangement 104 in integrated circuits, only low-ohmic metallic metal structures, such as the metal sheet 108a, are referred to as conductive traces in the following description. Although aluminum is presently still prevalent as material for conductive trace structures, tungsten is extremely advantageous at via diameters below about 0.5 µm due to its leveling function. Moreover, however, copper also increasingly finds industrial application, which is more lowly ohmic and current loadable than aluminum. With reference to the present invention, however, substantially all sufficiently low-ohmic and current-loadable metals, such as also TiN, may be used as starting material for the structured metal sheet 108a.

In order to protect the magnetoresistive sensor module 100 illustrated in FIG. 1 according to the invention with the integrated circuit arrangement 104, the metal sheet 108a, and the magnetoresistive sensor structure 110 against corrosion and mechanical damage, after the structuring or after the structured application of the magnetoresistive sensor structure 110, a passivation layer arrangement 114 may optionally be applied, which is opened only at those locations at which optional connecting wires (bond wires; not shown in FIG. 1) can be attached at pads (not shown in FIG. 1). The passivation layer arrangement 114 may for example consist of an oxide, e.g. plasma oxide, or a nitride, e.g. plasma nitride, each with a layer thickness of about 0.1 to 5 µm, and preferably from about 0.5 to 1 µm. But double layers of oxide and/or nitride materials with the above layer thicknesses are also possible.

The metal sheets preferably have a thickness of about 0.1 to 2.5 µm, and preferably from about 0.35 to 0.55 µm.

The procedure for manufacturing a magnetoresistive sensor module according to the present invention may thus be summarized as follows. The basic process of the basic semiconductor manufacturing process is performed until the manufacture of the metal sheet 108a. Annealing the device present until then may take place with an anneal procedure (if required). The magnetoresistive sensor structure 110 is now structuredly applied on an exposed area of the insulation layer 108b. The insulation layer 108b thus serves for electrical insulation of the magnetoresistive sensor structure from the metal sheet 108a, wherein the insulation layer 108b may, if required, be planarized for creating a defined and planar surface for the magnetoresistive sensor structure 110. For this, so-called CMP (chemical mechanical polishing) methods or corresponding planarization methods may be employed, for example.

For contacting the magnetoresistive sensor structure, the metal sheet 108a of the basic process (i.e. prior to applying the magnetoresistive sensor structure 110) is now provided with vias 112 through the insulation layer 108b, wherein the vias are filled with metal, e.g. tungsten, and the surface is planarized flush with the insulation layer 108b. Then, the magnetoresistive sensor structure is applied and structured. Of course, it is also possible that the magnetoresistive sensor structure is applied in already structured manner. Optionally, then the passivation layer arrangement 114 is applied, wherein here a further anneal procedure may additionally take place, which should, however, be compatible with the magnetoresistive sensor structure already applied. Finally, now optional contact pads may be opened on the metal sheet 108 or also on the magnetoresistive sensor structure 110 with a standard process of the basic semiconductor manufacturing process.

In above anneal procedures, temperatures from 150 to 350° C. may be used.

In the following, with reference to FIG. 2, a further embodiment of an inventive magnetoresistive sensor module 200 according to the present invention will now be explained. For simplification of the following description, in FIG. 2, functionally like functional elements have the same reference numerals as in FIG. 1, wherein repeated description of these features is omitted. Furthermore, all above statements with reference to the functional elements illustrated in FIG. 1 are equally applicable to the corresponding functional elements in FIG. 2.

As can be seen in the magnetoresistive sensor module 200 illustrated in FIG. 2, this exemplarily comprises five metal sheets 108a-1 to 180a-5, further designated with M1-M5. Furthermore, the additional passivation layer 116 is illustrated in FIG. 2. Furthermore, an opening 118 for an optional bond wire 120 with a bond contact is illustrated in FIG. 2.

The above statements explained in FIG. 1 thus are substantially also applicable to the magnetoresistive sensor module 200 according to the invention illustrated in FIG. 2.

In the magnetoresistive sensor module illustrated in FIG. 2, the basic process of the basic semiconductor manufacturing process is also processed until the last metal sheet 108a-5 (M5), wherein at this point also an anneal procedure may be performed. So that the magnetoresistive sensor structure 110 to be applied later can be electrically insulated, on the last metal sheet 108a-5, an insulation layer 108b-5 (at least partially) surrounding it is further applied. It is to be noted that the first four metal sheets 108a-1 to 108a-4 also comprise (at least partially) surrounding insulation areas 108b-1 to 108b-4.

For example, if the topmost insulation layer 108b-5 has manufacture-induced uneven spots and should thus be planarized in order to create a defined and planar surface for the magnetoresistive sensor structure 110 still to be applied, a CMP treatment of the surface of the insulation layer 108b-5 can also be performed here. For contacting the magnetoresistive sensor structure still to be applied, the last metal sheet 108a-5 of the basic process is provided with vias 112 through the insulation layer 108b-5, wherein the created vias are filled with metal, e.g. tungsten, and the surfaces thereof are preferably planarized flush with the surface of the topmost insulation layer 108b-5. Then, the magnetoresistive sensor structure 110 is applied and structured. Finally, a suitable passivation arrangement 114, 116 is optionally applied, which for example comprises an oxide/nitride passivation layer 114 and an additional passivation layer 116 of photoimide material. At this time, an additional anneal procedure may also take place here, which should, however, be compatible with the magnetoresistive sensor structure already applied. Finally, so-called connecting pads 122 are opened with the standard process of the basic manufacturing process, so that the magnetoresistive sensor module 200 according to the invention illustrated in FIG. 2 may be connected to a lead frame (not shown in FIG. 2) of a device package by means of optional bond wires 120, for example.

In the following, with reference to FIG. 3, a further embodiment of an inventive magnetoresistive sensor module 300 according to the present invention will now be explained. For simplification of the following description, functionally like functional elements in FIG. 3 have the same reference numerals as in FIGS. 1 or 2, wherein repeated description of these features is omitted. Furthermore, all above statements with reference to the functional elements illustrated in FIGS. 1 or 2 are equally applicable to the corresponding functional elements in FIG. 3.

As can be seen from FIG. 3, the magnetoresistive sensor module 300 illustrated there comprises a metal sheet 302 with an insulation layer 304 (at least partially) surrounding it. This metal sheet 302 is disposed opposite the first metal sheet 108a with reference to the magnetoresistive sensor structure 110, so that the magnetoresistive sensor structure 110 may be regarded as between the metal sheets 108a and 302. It should, however, become clear that, corresponding to the embodiment of the inventive magnetoresistive sensor module 200 of FIG. 2, a substantially arbitrary number of metal sheets 108a, i.e. at least one metal sheet, may also be arranged here on the semiconductor substrate 102 and below the magnetoresistive sensor element 110. Furthermore, of course several metal sheets 302 may also be disposed above the magnetoresistive sensor structure 110 and also be structured, in order to form conductor structures, for example, if this is required.

In the present description, the terms "above" or "below" are to be referred to directions "in" the drawing plane of FIGS. 1-3.

The arrangement of the inventive magnetoresistive sensor module 300 illustrated in FIG. 3 obviously is especially advantageous for TMR sensor structure, since there the current direction may flow perpendicularly through the magnetoresistive structures. Thereby, a simplified electrical connection and coupling of the magnetoresistive sensor structure 110 may be achieved. However, it should also become clear that substantially all under the term "magnetoresistive sensor structures" can be electrically contacted with the additional metallization sheet 302 by means of additional vias 112.

In the embodiment illustrated in FIG. 3, it is thus only required to provide a further insulation layer 304 and also the additional metal sheet 302 in the manufacturing process after applying the magnetoresistive structure 110. On this arrangement, optionally a passivation arrangement or an additional passivation arrangement (not shown in FIG. 3) may now also be applied again, as already illustrated on the basis of FIGS. 1 and 2. Furthermore, the optional passivation arrangement or additional passivation arrangement may be opened to expose connecting contacts 122 for optional contacting, for example, by means of bond wires on the additional metal sheet 302.

From the embodiments of the inventive magnetoresistive sensor modules 100, 200 and 300 illustrated on the basis of FIGS. 1, 2 and 3 and the accompanying manufacturing methods, it becomes clear that the inventive concept for manufacturing an magnetoresistive sensor module according to the invention may be integrated into a conventional semiconductor manufacturing process of an integrated semiconductor circuit, wherein the magnetoresistive sensor structure may here either be placed between the last metal sheet of the basic manufacturing process and the passivation or may also be placed between two arbitrary neighboring metal sheets. The contacting of the magnetoresistive sensor structure may be achieved from underneath (with reference to the magnetoresistive sensor structure in direction of the semiconductor substrate) by the use of a standard inter-metal contact process (i.e. e.g. W plugs). Furthermore, contacting the magnetoresistive sensor element 110 may be obtained from above either by an additional metal layer 302 (cf. FIG. 3) or by an additional metal contact (via). The latter procedure is therefore particularly suited for TMR sensor structures.

Moreover, the inventive procedure for manufacturing a magnetoresistive sensor module is advantageous in that a surface planarized with a CMP procedure and conditioned correspondingly, for example, is used as starting point and growth foundation for the magnetoresistive sensor structure, which is preferably embodied as an xMR layer stack. With this, according to the present invention, a magnetoresistive sensor module integrated with an active circuit arrangement can be obtained.

Since mechanical tension differences in the various layers in the inventive magnetoresistive sensor modules 100, 200, 300 illustrated in FIGS. 1, 2, and 3 often cannot be avoided, insufficient sealing adhesion or tensions of the package molding compound may lead to cracks in the metallization layer (metal sheet 108a) and, if several metal sheets 108a are provided, above all in the topmost metallization layer as well as in the passivation layer arrangement 114. In order to remedy this problem, the passivation layer thickness will preferably be as great as possible, i.e. preferably greater than the thickness of the metal sheet 108a (or the topmost metal sheet 108a). Furthermore, relatively wide metal trace structures are slotted. Furthermore, it should be avoided that conductive traces are provided in the area of the outer chip corners. An additional polyimide layer, which may have a thickness of 0.5 to 10 μm and preferably from about to 1 to 5 μm, for example, has turned out to be especially effective. This additional passivation layer (not shown in FIG. 1) preferably is as a so-called stress relief and furthermore provides for excellent adhesion between the molding compound and the chip surface in an accommodation of the inventive magnetoresistive sensor module in a package.

In the following, with reference to FIG. 4, a further embodiment of an inventive magnetoresistive sensor module 400 according to the present invention will now be explained. For simplification of the following description, functionally like functional elements in FIG. 4 have the same reference numerals as in FIGS. 1-3, wherein repeated description of these features is omitted. Furthermore, all above statements with reference to the functional elements illustrated in FIGS. 1-3 are equally applicable to the corresponding functional elements in FIG. 4.

For the detection of an angle unique in 360°, GMR/TMR spin valve structures require several magnetoresistive individual elements, which are arranged in a Wheatstone bridge circuit, for example, and the reference magnetization of which may comprise up to four locally different directions. For adjustment of the respective reference direction of each magnetoresistive individual element, the spin valve layer system now has to be heated above the so-called "blocking temperature", which is up to 400° C. depending on the material system employed, and cooled again in a lateral magnetic field of the desired direction. For manufacturing a magnetoresistive sensor module in which all magnetoresistive sensor elements or sensor structures (e.g. bridge elements) are integrated on a chip, locally heating the respective elements is therefore required, without also heating neighboring elements above the "blocking temperature" during the magnetization procedure. For example, one possibility is locally illuminating with a laser light source with sufficient energy.

As it becomes obvious from the above statements on the embodiments of FIGS. 1, 2 and 3, for cost and performance reasons, it is advantageous to "vertically" integrate the magnetoresistive sensor structure together with the electronic evaluating/control circuitry on the semiconductor circuit substrate. For highest compatibility with the fabrication process, it is now required to enable also vertical integration, i.e. position the magnetoresistive sensor structures above the integrated electronic semiconductor circuit arrangements, as well as to implement a partly necessary additional passivation with a photosensitive polyimide. The polyimide material often is a very important constituent to noticeably improve the adhesion between the package and the chip surface. The photoimide material typically is between 2.5 μm and 6 μm thick. In order to obtain fabrication-suited yield, the electronic semiconductor circuit elements underlying the magnetoresistive structures must not be affected by the laser irradiation on the one hand, wherein the launched laser power should not scatter significantly across the semiconductor substrate (wafer) and also from wafer to wafer by layer thickness variations of the layers between the magnetoresistive structures and the laser, for example, on the other hand.

A further aspect of the present invention consists in using a metal sheet of the metal/insulator arrangement 108 of a magnetoresistive sensor module 100, 200, 300 from FIGS. 1, 2, and 3, respectively, for protecting the sensitive areas of the substrate material 104 from inadvertent influence of the radiation from a laser light source in the conditioning. One of the metal sheets may be embodied as lightproof shield so that the proportion of the radiation emitted from the light source not absorbed by the magnetoresistive structure 110 is shielded, so that inadvertent illumination of a sensitive area of the substrate material 104 lying in the extension of the optical train and potential damage of devices or circuit elements resulting there from is prevented.

FIG. 4 shows a schematic illustration of a top view onto a device according to a further embodiment of the present invention, wherein FIG. 4 only shows a metal sheet 108a, which includes the areas 402 to 408 galvanically separated in the plane of the metal sheet 108a, and a magnetoresistive structure or GMR area 110, which substantially has a meander structure. Here, the metal sheet 108a, also referred to as M5 in FIG. 4 may match particularly the fifth metal sheet 108a-5 from FIG. 2.

The metal plane 108a may here at the same time be used as lightproof shield and as feeding structure for the magnetoresistive structure 110. In this case, however, recesses, which prevent shorting the magnetoresistive structure 110 via the metal plane 108a, have to be provided in the metal plane 108a. FIG. 4 exemplarily shows two such recesses in the metal sheet 108a, which are designated with $S_A$ and $S_B$. In the embodiment shown in FIG. 4, the area 404 and the area 406 of the metal sheet 108a serve as connecting areas for the magnetoresistive structure 110, which is also referred to as GMR in FIG. 4.

Between the area 404 or 406 and the magnetoresistive structure 110, there is a metallic connection (via 112; cf. FIGS. 1-3) passing substantially perpendicularly to the main surface of the substrate material and not shown in FIG. 4 for perspective reasons. The areas 404 and 406 of the metal sheet 108a, together with the areas 402 and 408, form a lightproof shield for sensitive areas of the substrate material, which lie in the further course of the optical train of the radiation emitted from the light source in the step of heating the magnetoresistive structure 110. Here, the metal sheet 108a includes at least a metal not transparent in the wavelength region of the radiation used, so that the radiation emitted by the light source and not absorbed by the magnetoresistive structure 110 is reflected or absorbed by the metal sheet 108a.

Here, the metal sheet 108a, apart from the function as lightproof shield, additionally fulfills the task to prevent additional heating of sensitive areas in the substrate material in the surroundings of the magnetoresistive structure by distributing the heat to a greater area of the composite arrangement due to the in general substantially better thermal conductivity of metals as compared with semiconducting or insulating materials. Hereby, the metal sheet 108a thus not only acts as a lightproof shield, but also as a heat barrier preventing or weakening the expansion of the heat deposited in the magnetoresistive structure 110 via thermal conduction to sensitive areas of the substrate material.

So that the metal plane 108a can be used as a lightproof shield and as a signal plane at the same time, in the present embodiment for contacting the magnetoresistive structure 110, like in the embodiment shown in FIG. 4, the metal sheet must have recesses to prevent shorting of the magnetoresistive structure 110, as this has already been explained further above. In order to prevent the radiation emitted in the step of conditioning the magnetoresistive structure 110 from reaching sensitive areas of the substrate material lying in the further course of the optical train, the magnetoresistive structure 110 may comprise, apart from the actual meander structure of the magnetoresistive structure, such structures that cover the necessary recesses or gaps in the metal sheet 108a in the extension of the optical train of the radiation emitted from the light source.

FIG. 4 thus exemplarily shows a gap or a recess $S_A$ in the metal sheet 108a, which galvanically separates the areas 404 and 408 of the metal sheet 108a from each other. As FIG. 4 also shows on the basis of the gap labeled $S_B$, in the plane of the magnetoresistive structure and taking the optical train of the radiation emitted from the light source into account, a gap in the metal sheet 108a may be filled by magnetoresistive material or by a magnetoresistive layer system so that the plane of the magnetoresistive structure 110 forms a lightproof shield together with the metal sheet 108a.

In summary, it may thus be stated that FIG. 4 schematically shows an embodiment of the inventive lightproof shield below a magnetoresistive or GMR meander structure, in which the shielding and the wiring of the magnetoresistive or GMR structure take place in the same metal plane 108a or M5. FIG. 1 shows the corresponding lightproof shield below the GMR structure in cross section. In the embodiment shown in FIG. 4, the optical shield is embodied in the last metal plane $108a_{1-5}$ of a five metal sheet process. With simultaneous use of the fifth or last metal plane $108a_{1-5}$ for the contacting of the magnetoresistive structure 110 for the GMR/TMR wiring, the layout of the metal sheet $108a_{1-5}$, however, has to be chosen so as to have no "gaps" for the laser light preferably incident perpendicularly. FIG. 4 shows for this case that a gap $S_A$ has to be provided between the wiring area 404 and the shield area 408, in order to avoid shorting of the magnetoresistive structure or the GMR terminals. For optical shading of the underlying devices or a sensible area of the substrate material, this gap area $S_A$ can be filled with GMR material or a magnetoresistive layer system, as this is exemplarily shown at the gap designated as $S_B$, without significantly influencing the sensor properties of the magnetoresistive structure.

According to the present invention, thus an individual metal plane or also a combination of several metal planes may form the shield lightproof with reference to the conditioning radiation used, so that as much radiation energy as possible is kept away from the sensitive semiconductor substrate. Here, at least so much radiation energy should be shielded that no (e.g. thermal) impairment or damage of the circuit arrangements integrated in the semiconductor substrate can occur.

With reference to the inventive concept for manufacturing a magnetoresistive sensor module, it now also becomes clear that the inventive implementation may be achieved in a CMOS/BiCMOS-compatible manufacturing fabrication procedure for attaining fabrication-suited local laser conditioning of integrated magnetoresistive sensor elements and particularly GMR and TMR sensor elements with high yield, because the structured metal sheets of the metal-insulator arrangement, i.e. the metal layer stack above the semiconductor circuit substrate, may provide a lightproof shield below the magnetoresistive structure by the fact that the metal planes underlying the magnetoresistive sensor structure are embodied or structured corresponding to the irradiation angle of the laser irradiation (preferably a perpendicular incident angle) so that inadvertent illumination of the semiconductor circuit areas lying below the magnetoresistive sensor structures on the integrated semiconductor circuit substrate and its possible damage due to the laser irradiation can be prevented.

The inventive concept for manufacturing a magnetoresistive sensor module thus offers a series of advantages.

The method for integration of a magnetoresistive sensor structure with an active semiconductor circuit arrangement may thus be built into every basic semiconductor manufacturing process with slight adaptations. The applied magnetoresistive sensor structure is disposed on a surface that is planar and to be conditioned independently of the basic semiconductor manufacturing process. With this, the ideally planar contact area between magnetoresistive sensor structure and contact pads allows for an extremely robust and reliable contacting of the magnetoresistive sensor structure, i.e. the xMR layer systems. Problems like tear-offs, thinning, etc. can be avoided according to the invention. Furthermore, the active sensor layer, i.e. the magnetoresistive sensor structure 110, is not changed by an etching process from above.

Due to the small thickness of the magnetoresistive sensor structures in the range from about 2 to 200 μm, and preferably about 50 μm, the final passivation with the passivation arrangement 114 and/or the additional passivation layer 116 is further disposed on a largely planar surface and thus is tight in a large process window. Optionally, it is also possible that the last inter-metal connections (via) of the basic semiconductor manufacturing process are used as a sensor terminal, i.e. as a terminal of the magnetoresistive sensor structure.

Moreover, in the inventive manufacturing method of a magnetoresistive sensor module, the final anneal procedure for the integrated process, i.e. the basic semiconductor manufacturing process, and for the magnetoresistive sensor module may take place independently, so that particularly the anneal process that can be performed at lower temperature for the sensor module may be performed later, without damaging the other integrated circuit parts, and the anneal procedure taking place at high temperatures for the remaining integration may conversely be performed prior to the creation of the sensor module, so that no impairment or destruction of the sensor module occurs.

Thus, it becomes clear that substantially only standard semiconductor manufacturing processes are required for the inventive method of manufacturing a magnetoresistive sensor module. The resulting magnetoresistive sensor module may be put on the active integrated semiconductor circuit in space-saving manner, wherein this is referred to as vertical integration in this connection.

Furthermore, at least one of the previously described metal sheets may be embodied below the magnetoresistive sensor structure as a lightproof shield, so that inadvertent illumination of the active circuit areas, underlying the magnetoresistive sensor structure, of the semiconductor circuit arrangement in the semiconductor substrate and its possible damage may thereby be prevented. With this, according to the invention, fabrication-suited local laser conditioning of integrated magnetoresistive sensor modules may be implemented with high yield in a CMOS/BiCMOS-compatible fabrication flow.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of manufacturing a magnetoresistive sensor module, comprising:
   providing a semiconductor substrate, wherein a semiconductor circuit arrangement is integrated adjacent to a main surface of the semiconductor substrate,
   forming a metal-insulator arrangement onto the main surface of the semiconductor substrate, the forming of the metal-insulator arrangement comprising:
   applying a structured metal sheet on an insulating layer of the metal-insulator arrangement;

establishing an electrical connection between the structured metal sheet and the semiconductor circuit arrangement; and applying a topmost layer of insulation material at least partially covering the structured metal sheet;

generating and filling with metal a first via through a first aperture and generating and filling with metal a second via through a second aperture in a surface of the topmost layer of insulation material, so that the first metal filled via is electrically connected to a first portion of the structured metal sheet, and the second metal filled via is electrically connected to a second portion of the structured metal sheet, the second portion being electrically isolated from the first portion;

polishing the surface of the topmost layer of insulation material and an entire surface of the first and second metal filled vias within the first and second apertures so that an entire polished planar surface of the first and second metal filled vias is flush with edges of the first and second apertures on a polished planar surface of the topmost layer of insulation material; and applying a magnetoresistive sensor structure onto the polished planar surface of the topmost layer of insulation material and the polished planar surface of the first and second metal filled vias, so that the magnetoresistive sensor structure fully covers the first and second metal filled vias and is planer and flush with the polished planar surfaces of the first and second metal filled vias and the polished planar surface of the topmost layer of insulation material, so as to establish an electrical connection between the magnetoresistive sensor structure and the first and second portions of the structured metal sheet, so that the magnetoresistive sensor structure is connected to the integrated circuit arrangement.

2. A method according to claim 1, wherein the polishing and/or planarizing is performed by a CMP (chemical mechanical polishing) process.

3. A method according to claim 1, wherein the establishing of the electrical connection from the structured metal sheet to the semiconductor circuit arrangement comprises creating at least one electrically conductive via.

4. A method according to claim 3, further comprising filling the at least one electrically conductive via with conductive material.

5. The method of claim 4, wherein the filling comprises using tungsten as the conductive material.

6. A method according to claim 1, wherein the forming of the metal-insulator arrangement comprises arranging the structured metal sheet to comprise a conductor structure and/or a contact connecting area.

7. A method according to claim 1, further comprising applying further insulation material on the metal-insulator arrangement with the magnetoresistive sensor structure.

8. A method according to claim 7, wherein the applying of the further insulation material comprises applying a passivation arrangement of oxide and/or nitride material.

9. A method according to claim 8, further comprising opening the passivation arrangement.

10. A method according to claim 9, wherein, in the opening, contact pads on the metal sheet or the magnetoresistive sensor structure are exposed.

11. A method according to claim 7, further comprising applying an additional passivation arrangement.

12. A method according to claim 11, wherein in the applying, a photoimide material is applied as the additional passivation arrangement.

13. The method of claim 11, further comprising opening the additional passivation arrangement.

14. A method according to claim 1, wherein the forming of the metal-insulator arrangement comprises applying a plurality of structured metal sheets and insulation layers, the insulation layer at least partly surrounding the structured metal sheets, the structured metal sheets being vertically stacked above the semiconductor substrate.

15. The method of claim 14, further comprising locally illuminating the magnetoresistive sensor structure by a light source for conditioning the magnetoresistive sensor structure by way of launched optical power; and forming the metal-insulator arrangement comprising arranging the structured metal sheet such that the arranged structured metal sheet provides, during the locally illuminating, a light shield for the semiconductor circuit arrangement.

16. The method of claim 15, wherein the forming of the metal-insulator arrangement comprises structuring the metal sheet so as to provide, during the locally illuminating, a heat barrier or heat dissipater with regard to the launched optical power.

17. A method according to claim 1, further comprising: after the applying the magnetoresistive sensor structure, applying a further insulation layer and an additional metal sheet.

18. A method according to claim 17, further comprising establishing an electrical connection between the magnetoresistive sensor structure and the additional metal sheet.

19. The method of claim 17, wherein the plurality of metal sheets interacts to provide the light shield for the semiconductor circuit arrangement.

20. A method according to claim 1, wherein the step of applying a magnetoresistive sensor structure comprises applying an AMR (anisotropic magnetoresistance) structure, a GMR (giant magnetoresistance) structure, a CMR (colossal magnetoresistance) structure, an EMR (extraordinary magnetoresistance) structure, a TMR (tunnel magnetoresistance) structure, or a magnetoresistance structure.

21. A method according to claim 20, wherein the applying of the magnetoresistive sensor structure comprises forming the GMR structure as a spin valve structure.

22. The method of claim 1, further comprising accommodating the magnetoresistive sensor module in a package with contact pads, in order to obtain a sensor device.

23. A method according to claim 1, wherein the method of manufacturing a magnetoresistive sensor module is performed on wafer level with a multiplicity of magnetoresistive devices.

24. The method of claim 1:
wherein the surface of the topmost layer of insulation material is planarized prior to generating the first and second metal filled vias through the topmost layer of insulation material; and
wherein the entire surface of the first and second metal filled vias is polished to be flush with the polished planar surface of the topmost layer of insulation material after the first and second metal filled vias have been generated.

25. The method according to claim 1, further comprising arranging the first metal filled via and the second metal filled via to operate as contacts and define a variable resistance of the magneto resistive structure.

26. The method according to claim 1, wherein regions of the magnetoresistive sensor structure covering the first and second vias are configured to enable sensing.

27. A method according to claim 1, wherein the establishing of the electrical connection from the structured metal sheet to the semiconductor circuit arrangement comprises creating at least one electrically conductive via bridging the insulation material between the metal-insulator arrangement and the semiconductor substrate.

28. A method according to claim 1, wherein the establishing of the electrical connection from the structured metal sheet to the semiconductor circuit arrangement comprises creating at least one electrically conductive via extending from the first portion of the structured metal layer to at least a first terminal of the semiconductor circuit.

29. A method according to claim 1, wherein the establishing of the electrical connection from the structured metal sheet to the semiconductor circuit arrangement comprises creating the at least one electrically conductive via extending from the second portion of the structured metal layer to at least a second terminal of the semiconductor circuit.

30. The method according to claim 1, further comprising planarizing the topmost insulation material layer of the metal-insulator arrangement.

\* \* \* \* \*